(12) United States Patent
Schell et al.

(10) Patent No.: US 7,148,458 B2
(45) Date of Patent: Dec. 12, 2006

(54) CIRCUIT FOR ESTIMATING POSITION AND ORIENTATION OF A MOBILE OBJECT

(75) Inventors: Steve Schell, Arcadia, CA (US); Robert Witman, Pasadena, CA (US); Joe Brown, Valenica, CA (US)

(73) Assignee: Evolution Robotics, Inc., Pasadena, CA (US)

( * ) Notice: Subject to any disclaimer, the term of this patent is extended or adjusted under 35 U.S.C. 154(b) by 0 days.

(21) Appl. No.: 11/090,430

(22) Filed: Mar. 25, 2005

(65) Prior Publication Data

US 2005/0211880 A1    Sep. 29, 2005

Related U.S. Application Data

(60) Provisional application No. 60/602,239, filed on Aug. 16, 2004, provisional application No. 60/557,252, filed on Mar. 29, 2004.

(51) Int. Cl.
*G01C 21/02*    (2006.01)
*G01C 9/00*    (2006.01)

(52) U.S. Cl. .................................. 250/203.3; 702/150
(58) Field of Classification Search ............ 250/203.3, 250/214 A; 702/150–153; 382/103; 356/614, 356/622

See application file for complete search history.

(56) References Cited

U.S. PATENT DOCUMENTS 5,828,770 A * 10/1998 Leis et al. .................. 382/103
2002/0113973 A1* 8/2002 Ge .............................. 356/510

* cited by examiner

*Primary Examiner*—Thanh X. Luu
(74) *Attorney, Agent, or Firm*—Andrew S. Naglestad

(57) ABSTRACT

A circuit system for estimating position and orientation of a mobile object based on lights from a plurality of external light sources. The circuit comprises a position-sensitive light sensor for detecting the light sources and generating a first signal, an analog filter and amplification module ("AFA") for filtering and amplifying the first signal and generating a second signal, a digital signal processor ("DSP") for generating a coordinate system by extracting frequency components from the second signal.

22 Claims, 3 Drawing Sheets

CIRCUIT FOR ESTIMATING POSITION AND ORIENTATION OF A MOBILE OBJECT

RELATED APPLICATIONS

This application claims the benefit under 35 U.S.C. § 119(e) of U.S. provisional applications No. 60/557,252, filed Mar. 29, 2004 and No. 60/602,239, filed Aug. 16, 2004, the entirety of which is hereby incorporated by reference.

Appendix A, which forms a part of this disclosure, is a list of commonly owned co-pending U.S. patent applications. Each one of the co-pending applications listed in Appendix A is hereby incorporated herein in its entirety by reference thereto.

FIELD OF THE INVENTION

The present invention relates generally to a system for estimating position and/or orientation of an object, and more particularly to a circuit for estimating position and/or orientation of a mobile object with respect to a local coordinate systems, such as a mobile autonomous processor unit, or an autonomous robot.

SUMMARY OF THE INVENTION

A circuit system for estimating position and orientation of a mobile object based on lights from a plurality of external light sources. The circuit comprises a position-sensitive light sensor for detecting the light sources and generating a first signal, an analog filter and amplification module ("AFA") for filtering and amplifying the first signal and generating a second signal, a digital signal processor ("DSP") for generating a coordinate system by extracting frequency components from the second signal.

In one embodiment, the AFA has a transimpedance amplifier ("TIA") for amplifying the first signal from the position-sensitive light sensor, a first passive high-pass filter ("1$^{st}$ PHP") for removing DC bias from the output of the TIA, a passive notch filter ("PNF") for removing noise signals within a predetermined range of frequencies from the 1$^{st}$ PHP output, a second passive high-pass filter ("2$^{nd}$ PHP") for removing DC bias from the PNF output, a gain amplifier for amplifying the 2$^{nd}$ PHP output, and a passive low-pass filter ("PLP") for removing signals above a predetermined frequency from the gain amplifier output.

The embodiment further has a first buffer, coupled between the 1$^{st}$ PHP and the PNF, for reducing undesirable interaction due to different frequency response characteristics between the 1$^{st}$ PHP and the PNF, and a second buffer, coupled between the PNF and the 2$^{nd}$ PHP, for reducing undesirable interaction due to different frequency response characteristics between said PNF and said 2$^{nd}$ PHP.

DESCRIPTION OF THE PREFERRED EMBODIMENTS

A circuit for estimating position and orientation for a mobile object is disclosed. The overall and general methods and apparatus for position estimation using reflected light sources have been disclosed in the now-incorporated co-pending patent applications. The description that follows will elaborate on the circuit embodiments for the detection and processing of the images of the light sources in order to estimate the position and orientation of the mobile object.

Figure 1:
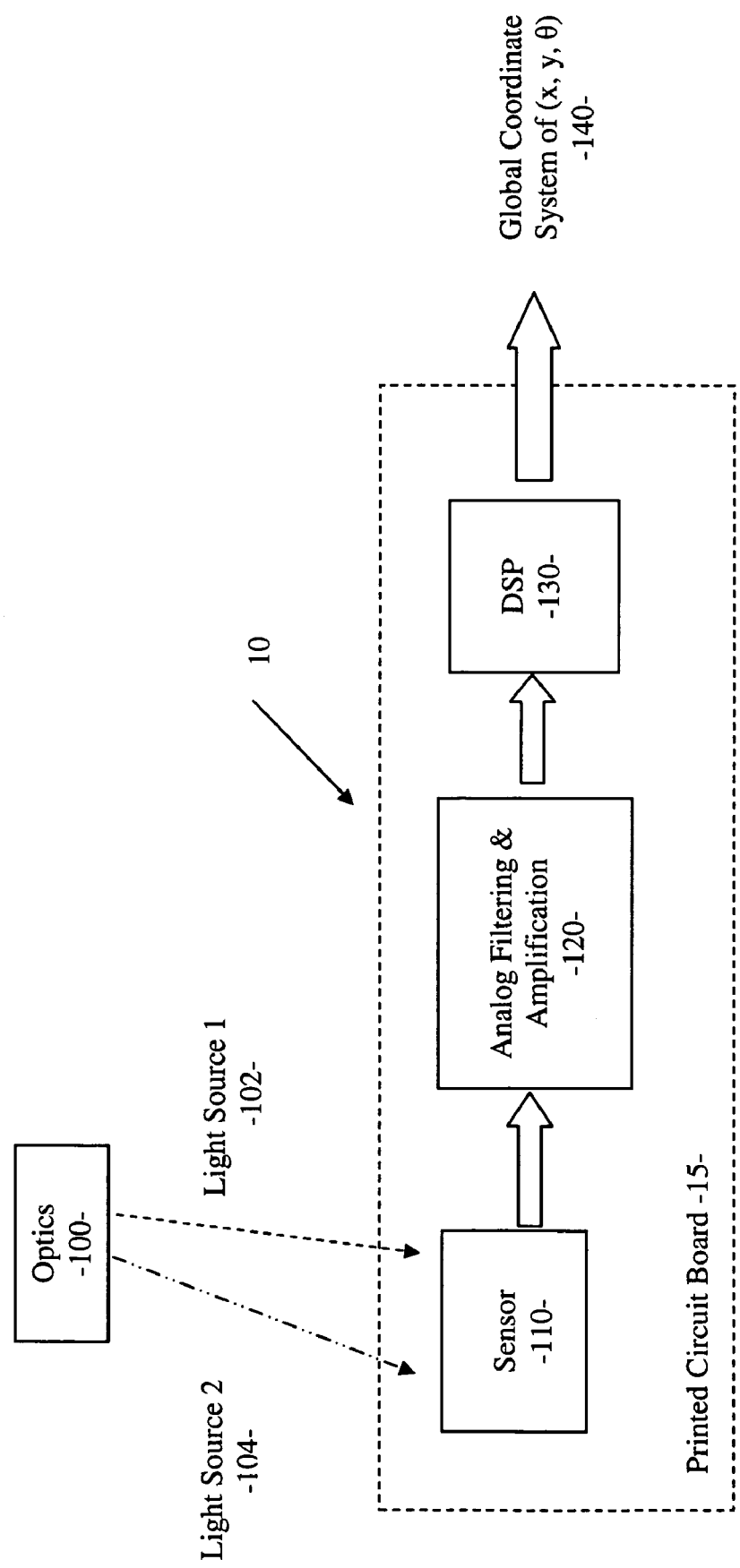
FIG. 1 is a simplified block diagram of an exemplary embodiment 10 in accordance with the present invention.

Reference is first to FIG. 1, where a simplified block diagram of an exemplary circuit embodiment 10 in accordance with the present invention is shown. The circuit embodiment 10 may be implemented on a printed-circuit board ("PCB") 15, or integrated into an application-specific integrated circuit ("ASIC"). The light is modulated at different frequencies and detected by the sensor 110 through the optics 100. It should be noted that as disclosed in the co-pending applications, the light may be generated from a variety of optical emitters, including without limitation visible light devices, invisible light devices, laser light devices, infrared light devices, polarized light devices, light-emitting diodes, laser diodes, light bulbs, halogen lights projectors and the like.

Through the optics 100, the sensor 110 detects the positions of the light spots from at least two light sources 102, 104, when the application is to determine 2-D position and orientation. The sensor 110 may be a position-sensitive detector ("PSD"), a segmented photo diode ("PD"), or an imager such as a CMOS imager. The sensor 110 is preferably a quad segmented photo diode ("PD"), e.g. Model No. S5980 from Hamamatsu Photonics, K. K. of Hamamatsu, Japan, with a web site at www.hamamatsu.com. The segmented PD may be acquired from UDT Sensors, Inc., of Hawthorne, Calif., with a web site at www.udt.com. As can be appreciated by those skilled in the art, a PSD is an optoelectronic position-sensitive light sensor utilizing photodiode surface resistance. Unlike discrete element detectors such as a CCD ("charge-coupled device"), a PSD provides continuous position data (X or Y coordinate data) and achieves high position resolution and high-speed response. The sensor 110 generates three or four (depending on the embodiment) signal currents, $I_x$, representative of the (X, Y) coordinate data of the light spots from the light sources 102, 104. In the case of the segmented PD, any number greater than one could be used. With two (2) segments, the user could tell in a single coordinate, e.g. X. With three (3) or more segments, X and Y coordinates could be produced.

The signal currents from the sensor 110 are then applied to the analog filter and amplification module ("AFA") 120 in order to filter out the ambient noise, the source of which can be various kinds of non-signal lights, e.g. incandescent light or fluorescent light. Since the signal currents from the sensor 110 are typically on the order of 1 nA, they are also amplified by the AFA 120 before the signals can be further processed. The AFA 120 will be further described with reference to FIG. 2 below.

The output signals from the AFA 120 are voltages, $V_x$, which are typically on the order of ±100 mV. The voltages are first converted into digital format through an analog-to-digital converter and then applied to the DSP 130 for processing. The analog-to-digital converter 280, as can be appreciated by those skilled in the art, may be implemented either external to, or as part of, the DSP 130.

The DSP 130, upon receiving the digital signals, operates a transformation algorithm, such as the well-known Fast Fourier Transform ("FFT"), Discrete Fourier Transform ("DFT") or the Goertzel algorithm, in order to extract the frequency components of the received signals. The Goertzel algorithm is preferred in the current embodiment, since it consumes fewer CPU resources than the continuous real-time FFTs in situations where only a few frequencies are to be detected. Using the magnitudes frequency components, the DSP 130 can calculate where the light spots hit the PSD sensor 110. Upon continuous calculation, e.g. at around 10 times per second, a global coordinate system can be developed based on the x, y positions of the light spots. With this global coordination system, the position and orientation, relative to the light sources 102, 104 of the mobile object on which the sensor 110 is positioned can be determined on a continuous basis. Such information can be used to provide navigation and guidance to an exemplary mobile object, such as an autonomous mobile robot, as disclosed in the co-pending applications.

The DSP 130, for example, may be obtained from a variety of commercial DSP vendors, such as Freescale (DSP56F802TA60), or Texas Instruments, based on the specific design requirements for each application.

AFA Module 120

Figure 2:
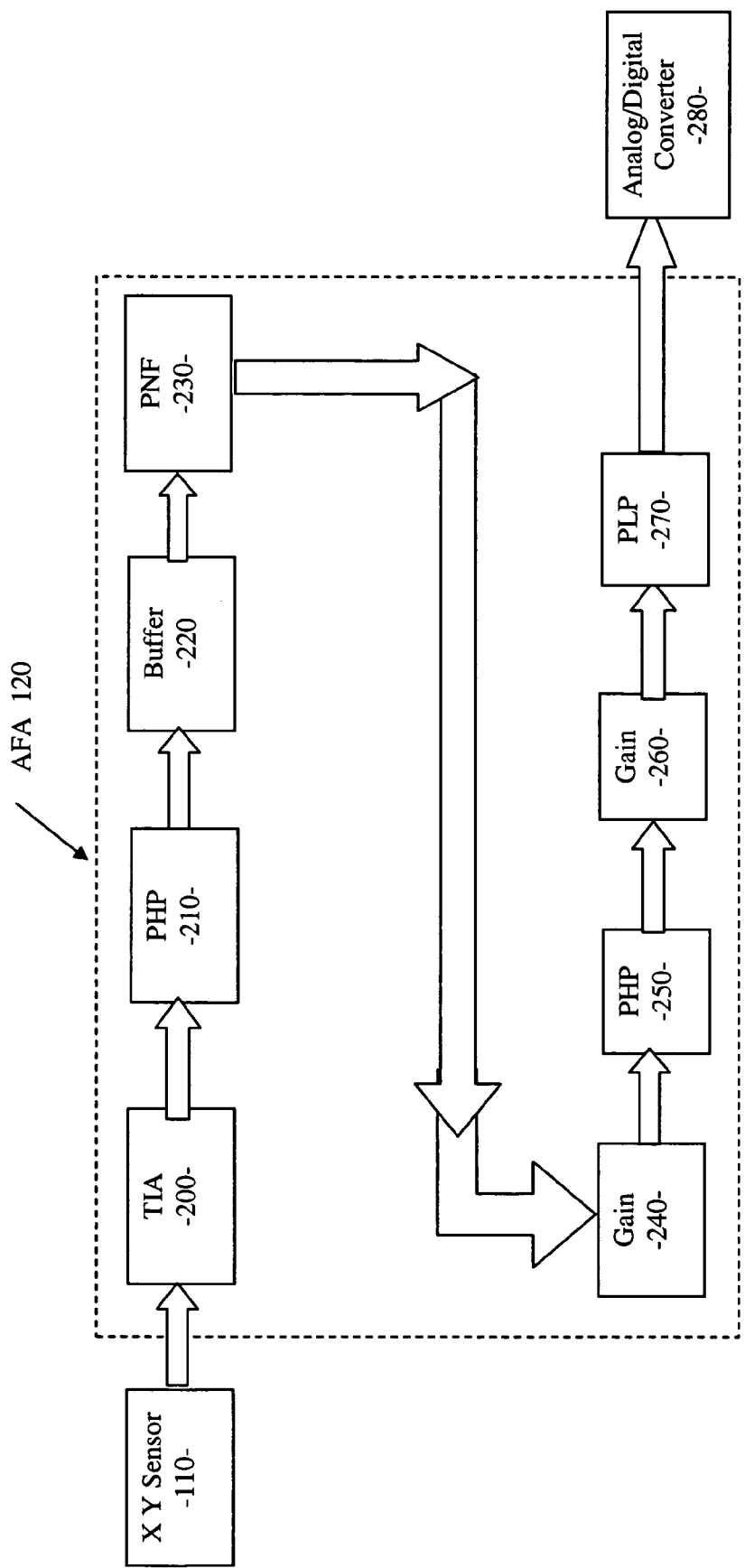
FIG. 2 is a simplified block diagram of an exemplary analog filter and amplification module 120 in accordance with the present invention.

Reference is now to FIG. 2, where a simplified block diagram of an exemplary AFA 120 is shown. The AFA 120 uses a combination of common analog filter components to achieve a more complex system frequency response. A preferred system is one that is capable of passing a band of frequencies, severely attenuating a different band of frequencies and finally, attenuating the remaining frequency band. This system also removes the DC component of the raw signal, leaving a well-characterized AC signal for analysis by a downstream microprocessor, e.g. DSP 130.

As can be appreciated by those skilled in the art of analog filter design, there are several trade offs that can be made when designing an analog filter:

Overall transfer function;
Cost;
Component count;
Component variation sensitivity.

The exemplary embodiment of the AFA 120 is advantageous in its ability to utilize passive (and thus low cost) filters to achieve a large ($\leq 35$ db) difference between the target frequency and the frequencies that must be 'severely' attenuated. This task is complicated by the proximity of the two different frequency ranges being less than 1 decade apart. This proximity requires a relatively complex transfer function. Despite this, this embodiment is able to use a minimal number of components to achieve this goal. In doing so, the embodiment achieves excellent immunity to part and process variation leading to a highly manufacturable and thus lower cost design, as will be further described below.

TIA (Transimpedance Amplifier) 200

Figure 3:
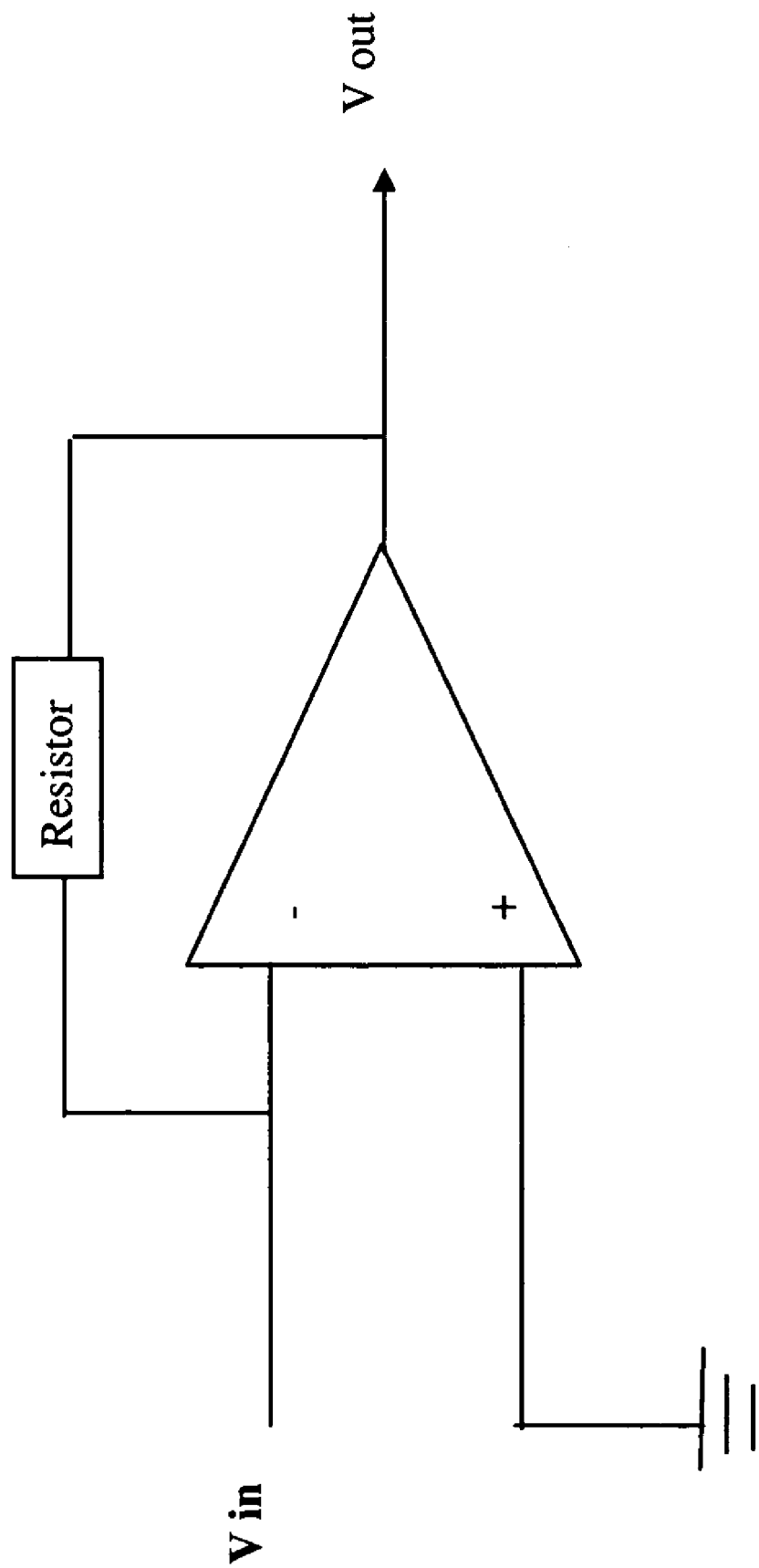
FIG. 3 is a simplified circuit diagram of an exemplary transimpedance amplifier 200 in accordance with the present invention.

Referring to FIG. 2, the AFA 120 expects a raw analog current be supplied to it from the sensor 110. This current is then converted into a voltage and amplified by the TIA 200. The preferred embodiment of the TIA 200 allows for an extremely small current to be measured, wherein the typical input current can be as low as 0.5 nA. FIG. 3 illustrates an exemplary circuit diagram of the TIA 200 of the preferred embodiment.

In addition, the TIA 200 makes use of a different bias voltage from the rest of the amplifiers in the AFA 120. By raising the bias voltage to near the positive rail of the op-amp (FIG. 3), the TIA 200 provides the largest amount of tolerance to DC noise. This works because the signal enters the op-amp's negative input and the actual AC signal is at most 10–20 mV at the output of the TIA 200. Thus, any DC current results in a decrease of the output bias level of the TIA 200, while maintaining the AC signal characteristics.

Before the necessary gain can be applied to the signal, the DC component should be completely removed, along with any frequencies that will produce much larger noise than the actual signal level PHP (Passive High-Pass Filter) 210

The PHP 210 may be implemented by a passive single-pole high-pass filter. This effectively removes any DC bias that has been introduced through environmental factors. Preferably its cutoff is set at 800 Hz.

BFR (Buffer) 220

The previous stage, PHP 210, and the following stage 230, are both made up of passive components. If they were directly concatenated in the circuit, they would interact with each other, causing different frequency response characteristics. To eliminate this problem, and aid in the component variation tolerance, a single op-amp is used as the buffer 220 between them. This single op-amp buffer 220 is configured as a simple voltage follower with no gain.

PNF (Passive Notch Filter) 230

The second large source of undesired noise is produced in a very small band of frequencies, specifically in this application, frequencies between 100 and 120 Hz. This noise is produced by incandescent light bulbs in the environment and can be 100 times larger than the actual signal amplitude. Although the incandescent light bulbs run on 50 Hz and 60 Hz of household electricity, they emit light due to the heating of the resistive tungsten, even when the current reverses its direction. Therefore, the light coming from the light bulbs can have an effective frequency of 100 and 120 Hz, the removal of which is the primary function of the PNF 230.

To that end, the PNF 230 is implemented to remove this 20 Hz wide band. Normal notch filters of this type have a much narrower band, i.e. 1–3 Hz; this design implements slightly 'detuned' values to widen the band. There is a negative impact on the band depth and thus the effective attenuation, but detuning allows a single part population to cover circuits for the entire world and aids in component tolerance sensitivity.

GAIN (Gain Amplifier) 240

The previous stage, PNF 230, and the following stage, PHP 250, are both made up of passive components. If they were directly concatenated in the circuit, they would interact with each other causing different frequency response characteristics. To eliminate this problem, and aid in the component variation tolerance, a single op-amp is used as a buffer 240 between them. This op-amp is also configured to provide gain to the signal in preparation for the signal being measured with the Analog-to-Digital converter 280. In some applications, a single op-amp may be utilized as a buffer instead, where the op-amp is configured as a simple voltage follower without any gain.

PHP (Passive High-Pass Filter) 250

The previous notch stage, PNF 230, produces a DC bias due to variations in part values. In some situations this would not have been a problem; however, the current application requires a large, 100×, gain to be applied to the signal. With this large magnitude of a gain, even the smallest offset, e.g. 20 mV, would be magnified and result in an op-amp saturating at a rail. To eliminate this problem, and allow for a large gain in the following stage, the passive high-pass filter 250 is utilized, effectively AC coupling the signal.

GAIN (Gain Amplifier) 260

Prior to this point, the actual signal level is still much too small to measure with the Analog-to-Digital converter 280. The gain amplifier 260 amplifies the signal to a measurable level and attempts to maximize the op-amp dynamic range and system SNR.

PLP (Passive Low-Pass Filter) 270

This PLP 270 stage adds an extra pole to the transfer function. This increases the rate of gain roll-off from the maximum system gain of 40 db @ 2 k Hz. There are inherent poles in the TIA 200 and GAIN 260 stages, making this the $3^{rd}$ pole in the transfer function. This provides a roll-off of 60 db/decade in the frequency response. With this added pole, the system provides 0 db of gain @ 40 kHz and attenuates all frequencies above this. Without this pole, the crossover point would have been moved out to over 80 kHz, allowing more high frequency noise to enter the system.

Although this invention has been described with reference to these specific embodiments, the descriptions are intended to be illustrative of the invention and are not intended to be limiting. Various modifications and applications may occur to those skilled in the art without departing from the true spirit and scope of the invention.

Appendix A

Incorporation by Reference of Commonly Owned Applications

The following patent applications, commonly owned and filed on the same day as the present application, are hereby incorporated herein in their entirety by reference thereto:

| Title | Application No. and Filing Date | Attorney Docket No. |
|---|---|---|
| "Methods And Apparatus For Position Estimation Using Reflected Light Sources" | Provisional Application 60/557,252 Filed Mar. 29, 2004 | EVOL.0050PR |
| "Circuit for Estimating Position and Orientation of a Mobile Object" | Provisional Application 60/602,238 Filed Aug. 16, 2004 | EVOL.0050-1PR |
| "Sensing device and method for measuring position and orientation relative to multiple light sources" | Provisional Application 60/601,913 Filed Aug. 16, 2004 | EVOL.0050-2PR |
| "System and Method of Integrating Optics into an IC Package" | Provisional Application 60/602,239 Filed Aug. 16, 2004 | EVOL.0050-3PR |
| "Methods And Apparatus For Position Estimation Using Reflected Light Sources" | Utility Application Serial No. TBD Filed Mar. 25, 2005 | EVOL.0050A |
| "Sensing device and method for measuring position and orientation relative to multiple light sources" | Utility Application Serial No. TBD Filed Mar. 25, 2005 | EVOL-0050A2 |
| "System and Method of Integrating Optics into an IC Package" | Utility Application Serial No. TBD Filed Mar. 25, 2005 | EVOL.0050A3 |

We claim:

1. A circuit system for estimating position and orientation of a mobile object based on lights from a plurality of external light sources, comprising:
   a position-sensitive light sensor, said sensor being disposed to detect said light sources and generate a first signal;
   an analog filter and amplification module ("AFA"), said AFA being disposed to filter and amplify said first signal and generate a second signal;
   a digital signal processor ("DSP"), said DSP being adapted to generate a coordinate system by extracting frequency components from said second signal.

2. The circuit system of claim 1, wherein said position-sensitive light sensor comprises a quad photo diode detector ("PD").

3. The circuit system of claim 1, wherein said position-sensitive light sensor comprises a plurality of photodiodes.

4. The circuit system of claim 1, wherein said position-sensitive light sensor comprises a plurality of position-sensitive detectors ("PSD").

5. The circuit system of claim 1, wherein said DSP generates said coordinate system by extracting frequency components from said second signal and calculating where said lights from said light sources are detected by said position-sensitive light sensor.

6. The circuit system of claim 4, wherein said DSP extracts said frequency components by using the Goertzel algorithm.

7. The circuit system of claim 4, wherein said DSP extracts said frequency components by using FFT.

8. The circuit system of claim 4, wherein said DSP extracts said frequency components by using DFT.

9. The circuit system of claim 1, wherein said AFA comprises:
   a transimpedance amplifier ("TIA"), being disposed to amplify said first signal from said position-sensitive light sensor to generate its output;
   a first passive high-pass filter ("$1^{st}$ PHP"), said $1^{st}$ PHP being disposed to remove DC bias from the output of said TIA and generate its output;
   a passive notch filter ("PNF"), disposed to remove noise signals between a predetermined range of frequencies from the output of said $1^{st}$ PHP and generate its output;
   a first gain amplifier, coupled to said PNF, being disposed to amplify the output from said PNF and generate its output;
   a second passive high-pass filter ("$2^{nd}$ PHP"), being disposed to remove DC bias from the output of said PNF and generate its output;

a second gain amplifier, coupled to said $2^{nd}$ PHP, being disposed to amplify the output from said $2^{nd}$ PHP and generate its output;

a passive low-pass filter ("PLP"), being disposed to remove signals above a predetermined frequency from the output of said gain amplifier and generate its output.

10. The circuit system of claim 9, said AFA further comprising:

a first buffer, coupled between said $1^{st}$ PHP and said PNF, disposed to reduce interaction between said $1^{st}$ PHP and said passive notch filter.

11. The circuit system of claim 10, wherein said first buffer is an op-amp configured as a voltage follower circuit with no gain.

12. The circuit system of claim 9, wherein said PNF is implemented with detuned values to widen said predetermined range of frequencies.

13. A circuit system for estimating position and orientation of a mobile object based on lights from a plurality of external light sources, comprising:

a position-sensitive light sensor, said sensor being disposed to detect said light sources and generate a first signal;

an analog filter and amplification module ("AFA"), said AFA being disposed to filter and amplify said first signal and generate a second signal, said AFA comprising:

a transimpedance amplifier ("TIA"), being disposed to amplify said first signal from said position-sensitive light sensor to generate its output;

a first passive high-pass filter ("$1^{st}$ PHP"), said $1^{st}$ PHP being disposed to remove DC bias from the output of said TIA and generate its output;

a passive notch filter ("PNF"), disposed to remove noise signals between a predetermined range of frequencies from the output of said $1^{st}$ PHP and generate its output;

a first gain amplifier, being disposed to amplify the output from said PNF and generate its output;

a second passive high-pass filter ("$2^{nd}$ PHP"), being disposed to remove DC bias from the output of said PNF and generate its output;

a second gain amplifier, being disposed to amplify the output from said $2^{nd}$ PHP and generate its output;

a passive low-pass filter ("PLP"), being disposed to remove signals above a predetermined frequency from the output of said gain amplifier and generate its output;

a first buffer, coupled between said $1^{st}$ PHP and said PNF, disposed to reduce interaction between said $1^{st}$ PHP and said passive notch filter;

a second buffer, coupled between said PNF and said $2^{nd}$ PHP, disposed to reduce interaction between said PNF and said $2^{nd}$ PHP;

a digital signal processor ("DSP"), said DSP being adapted to generate a coordinate system by extracting frequency components from the output of said PLP.

14. A circuit system of claim 13, wherein said first buffer is an op-amp configured as a voltage follower circuit with no gain.

15. A circuit system of claim 13, wherein said PNF is implemented with detuned values to widen said predetermined range of frequencies.

16. A circuit system of claim 13, wherein said DSP generates said coordinate system by extracting frequency components from said second signal and calculating where said lights from said light sources are detected by said position-sensitive light sensor.

17. A circuit system of claim 16, wherein said DSP extracts said frequency components by using the Goertzel algorithm.

18. A circuit system of claim 16, wherein said DSP extracts said frequency components by using an FIR filter.

19. A circuit system of claim 16, wherein said DSP extracts said frequency components by using an IIR filter.

20. The circuit system of claim 13, wherein said position-sensitive light sensor comprises a quad photo diode detector ("PD").

21. The circuit system of claim 13, wherein said position-sensitive light sensor comprises a plurality of photodiodes.

22. The circuit system of claim 13, wherein said position-sensitive light sensor comprises a plurality of position-sensitive detectors ("PSD").

* * * * *